United States Patent
Agonafer et al.

(10) Patent No.: US 6,431,260 B1
(45) Date of Patent: Aug. 13, 2002

(54) CAVITY PLATE AND JET NOZZLE ASSEMBLIES FOR USE IN COOLING AN ELECTRONIC MODULE, AND METHODS OF FABRICATION THEREOF

(75) Inventors: Dereje Agonafer, Southlake, TX (US); Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/742,919

(22) Filed: Dec. 21, 2000

(51) Int. Cl.$^7$ .................................................. F28F 7/00
(52) U.S. Cl. ...................... 165/80.4; 165/908; 361/699; 257/714
(58) Field of Search ............................. 165/80.4, 142, 165/908; 361/689, 699; 257/714

(56) References Cited

U.S. PATENT DOCUMENTS

| | | | |
|---|---|---|---|
| 2,937,855 A | 5/1960 | Hazen | 257/238 |
| 3,007,681 A | 11/1961 | Keller | 257/313 |
| 3,283,811 A | 11/1966 | Harvey | 165/142 |
| 3,368,546 A | 2/1968 | Wade | 126/350 |
| 4,072,189 A | 2/1978 | Chaix et al. | 165/142 |
| 4,210,101 A | 7/1980 | Touze | 122/20 B |
| 4,452,233 A | 6/1984 | Goodman, Jr., et al. | 126/443 |
| 4,479,534 A | 10/1984 | Rhodes | 165/142 |
| 4,750,086 A | 6/1988 | Mittal | 361/382 |
| 4,920,574 A | 4/1990 | Yamamoto et al. | 361/385 |
| 5,182,912 A | 2/1993 | Parker et al. | 60/641.8 |
| 5,228,502 A | 7/1993 | Chu et al. | 165/80.4 |
| 5,239,200 A * | 8/1993 | Messina et al. | 257/714 |
| 5,239,443 A | 8/1993 | Fahey et al. | 361/689 |
| 5,309,319 A * | 5/1994 | Messina | 165/80.4 |
| 5,390,076 A * | 2/1995 | Umezawa | 361/689 |

OTHER PUBLICATIONS

"Integrated Module Heat Exchanger", IBM Technical Disclosure Bulletin bol. 20, No. 11A, p. 4498, Apr. 1978.
"Multi–Chip Package With Cooling by a Spreader Plate in Contact With a Chip Having Cylindrical Holes Mating With an Inverse Frame Providing Water Flow Within its Pins", IBM Technical Disclosure Bulletin, pp. 141–142, Oct. 1998.
"Annulus–Convection Vertically Integrated Module Cooling", IBM Technical Disclosure Bulletin, No. 311, Mar. 1990.
"Mini Conformal Cold Plate", IBM Technical Disclosure Bulletin, pp. 494–495, Jun. 1984.
"Integrated Circuit Module Package Cooling Structure", IBM Technical Disclosure Bulletin, pp. 3898–3899, Mar. 1978.

* cited by examiner

Primary Examiner—Henry Bennett
Assistant Examiner—Terrell Mckinnon
(74) Attorney, Agent, or Firm—Andrew J. Wojnicki, Jr., Esq.; Kevin P. Radigan, Esq.; Heslin Rothenberg Farley & Mesiti P.C.

(57) ABSTRACT

Cavity plate and jet nozzle assemblies are presented for use in cooling an electronic module. The assemblies include a cavity plate having one or more blind holes formed therein and one or more jet nozzles each configured to reside within a respective blind hole of the cavity plate. A lower surface of the blind hole and/or jet nozzle is curved to facilitate the flow of fluid from the blind hole after impinging upon the lower surface of the blind hole. Various jet nozzle configurations are also provided which employ pedestals or radially extending fins. Further, the radially extending fins may interdigitate with inwardly extending fins on the inner sidewall of a respective blind hole in the cavity plate. Methods of fabricating the cavity plate and jet nozzle assemblies are also presented.

30 Claims, 11 Drawing Sheets

CAVITY PLATE AND JET NOZZLE ASSEMBLIES FOR USE IN COOLING AN ELECTRONIC MODULE, AND METHODS OF FABRICATION THEREOF

TECHNICAL FIELD

The present invention relates to heat transfer mechanisms, and more particularly, to heat transfer mechanisms and cooling assemblies for removing heat generated by an electronic circuit module.

BACKGROUND OF THE INVENTION

The efficient extraction of heat from electronic circuit modules for very large scale integrated circuit packages has presented a significant limitation on the design and use of such electronic modules. The power consumed in the integrated circuits generates heat which must in turn be removed from the package. Lacking an efficient heat transfer mechanism, the speed, reliability and power capabilities of the electronic circuit modules are limited. As the density of circuitry within very large scale integrated circuit chips has increased, the need for improved heat extraction has become even more acute since more densely packed chips tend to have a higher need for heat dissipation per unit area. It is also known that runaway thermal conditions and excessive heat generated by chips is a leading cause for failure of chip devices. Furthermore, it is anticipated that demand for heat removal from these devices will continue to increase indefinitely. Accordingly, it is seen that there is a significant need to continue to further improve upon cooling mechanisms for electronic devices.

DISCLOSURE OF THE INVENTION

Briefly summarized, the present invention comprises in one aspect a cooling assembly for an electronic module. The cooling assembly includes a thermally conductive cavity plate and at least one jet nozzle. The cavity plate has a first main surface and a second main surface with at least one blind hole formed in the second main surface extending towards the first main surface. Each blind hole has a lower surface and a side surface. The lower surface and the side surface connect at a non-orthogonal angle to facilitate the flow of fluid therealong. Each jet nozzle is sized to reside within a respective blind hole of the cavity plate. Fluid is introduced into the cavity plate through the at least one jet nozzle, and impinges upon the lower surfaces of the respective blind hole and flows outward through space defined between the side surface of the blind hole and the side surface of the jet nozzle. The non-orthogonal angle between the lower surface and the side surface of the blind hole facilitate fluid flow, after impinging upon the lower surface, outward through the space defined between the side surface of the blind hole and the side surface of the jet nozzle.

In another aspect, the present invention comprises a cooling assembly for an electronic module, wherein the cooling assembly includes a thermally conductive cavity plate and at least one jet nozzle. The cavity plate has a first main surface and a second main surface with at least one blind hole formed in the second main surface extending towards the first main surface. Each blind hole has a lower surface and side surface. Each jet nozzle is sized to reside within a respective blind hole of the cavity plate. Fluid introduced into the cavity plate through a jet nozzle impinges upon the lower surface of the respective blind hole and flows outward through a space defined between the side surface of the blind hole and a side surface of the jet nozzle. At least one jet nozzle includes a side surface having a plurality of radial channels disposed therein. The space defined between the side surface of the blind hole and the side surface of this jet nozzle includes the plurality of radial channels. Fluid delivered through the jet nozzle impinges upon the lower surface of the respective blind hole and flows outward from the blind hole at least partially through the plurality of radial channels disposed within the jet nozzle.

In still another aspect, a method of fabricating a cooling assembly for an electronic module is presented. The method includes: providing a thermally conductive cavity plate having a first main surface and second main surface with a plurality of blind holes formed in the second main surface extending towards the first main surface, wherein each blind hole has a lower surface and a side surface; providing a plurality of jet nozzles, at least one jet nozzle including radially extending pedestals on a side surface thereof which are sized to physically contact the sidewall of the respective blind hole when the jet nozzle is disposed at least partially therein; and interference fitting the at least one jet nozzle into a respective blind hole, wherein fluid introduced into the cavity plate through the jet nozzle impinges upon the lower surface of the blind hole and flows outward through the space defined between the side surface of the blind hole and the side surface of the jet nozzle, wherein the radially extending pedestals physically contacting the side surface of the blind hole define the size of the space between the side surface of the blind hole and the side surface of the jet nozzle.

In a further aspect, the invention comprises a method of fabricating a cooling assembly for an electronic module. This method includes: providing a thermally conductive cavity plate having a first main surface and a second main surface with a plurality of blind holes formed in the second main surface extending toward the first main surface, wherein each blind hole has a lower surface and a side surface, and radially inwardly extending fins disposed along the side surface; providing a plurality of jet nozzles, each jet nozzle including radially inwardly extending fins on a side surface surface configured to interdigitate with the inwardly extending fins on the side surface of a respective blind hole when the jet nozzle is disposed within the blind hole, with a gap being defined between the interdigitated fins; and disposing each jet nozzle of the plurality of jet nozzles within the respective blind hole, wherein fluid introduced into the cavity plate through a jet nozzle impinges upon the lower surface of the respective blind hole and flows outward through the gap defined between the interdigitated fins of the side surfaces of the blind hole and the jet nozzle.

To restate, various enhanced cavity plate and jet nozzle assemblies are disclosed herein to facilitate the removal of heat from a structure, such an electronic circuit module. These assemblies enhance the ability to remove a large amount of heat with a low temperature difference. Further, the assemblies presented provide a low coolant pressure drop, and are compact and modular in design.

Additional features and advantages are realized through the techniques of the present invention. Other embodiments and aspects of the invention are described in detail herein and are considered a part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1:
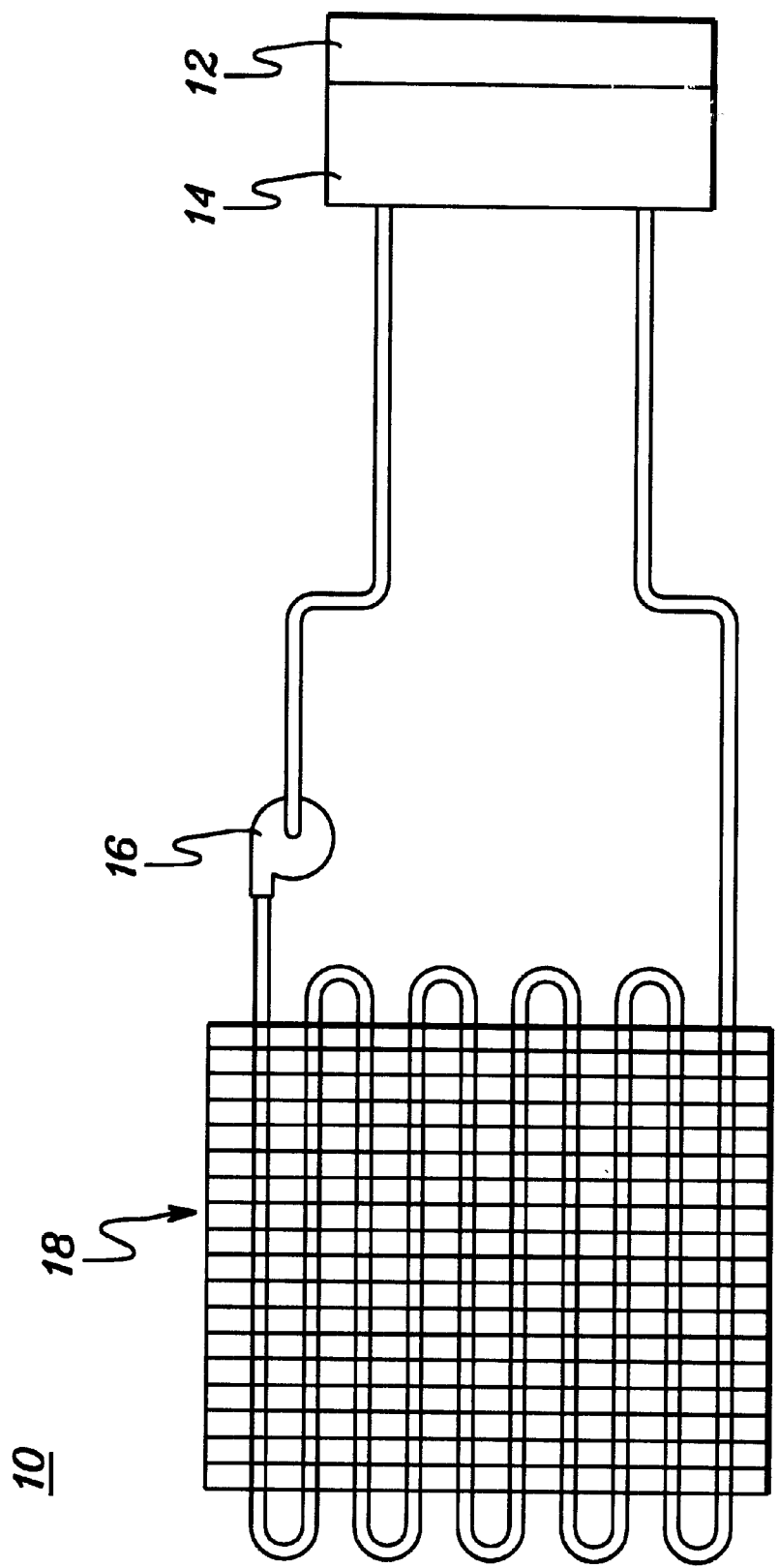
FIG. 1 illustrates a schematic of a hybrid air—closed loop coolant system to employ a cooling plate assembly in accordance with the principles of the present invention.

As noted above, computers continue to increase both in speed and function. Dissipated heat increases accordingly, even for complementary metal oxide semiconductor (CMOS) circuitry that was once considered a low power technology. The limits of existing cooling medium for large server processors are quickly being approached using conventional direct air cooling technologies (air cooled heat sinks) as heat dissipation rises. One possible extension to direct air cooling is a hybrid/closed loop coolant system 10 such as depicted in FIG. 1. With this system, heat is transferred from an electronic module 12 to the coolant (for example, water) via a cold plate 14 which is thermally coupled to the module 12. Coolant is pumped 16 through an air/coolant heat exchanger 18 for dissipation of the heat to the surrounding environment. The present invention is directed in one aspect to an enhanced cold plate 14 for use within a cooling structure, such as depicted in FIG. 1. Those skilled in the art, however, will note that the present invention can be applied to other cooling applications, and work with a multitude of coolant fluids. Circulating water systems or the evaporator/cold head of a refrigeration system are examples.

Disclosed herein are novel cooling assemblies, and methods of manufacture thereof, for high thermal performance cold plates in which a fluid impinges upon lower surfaces of cavities within a plate in thermal contact with an electronics module. In addition to the heat that is transferred to the fluid at the lower surface of the cavity, heat is also transferred across the cavity walls by virtue of a very small annular gap formed between each cavity wall and the fluid impinging jet nozzle. Heat is also conducted into the jet nozzle, in certain embodiments, through physical contact of each jet nozzle to the side wall of the respective cavity, thus enhancing the heat transfer into the body from an electronic module.

Figure 2:
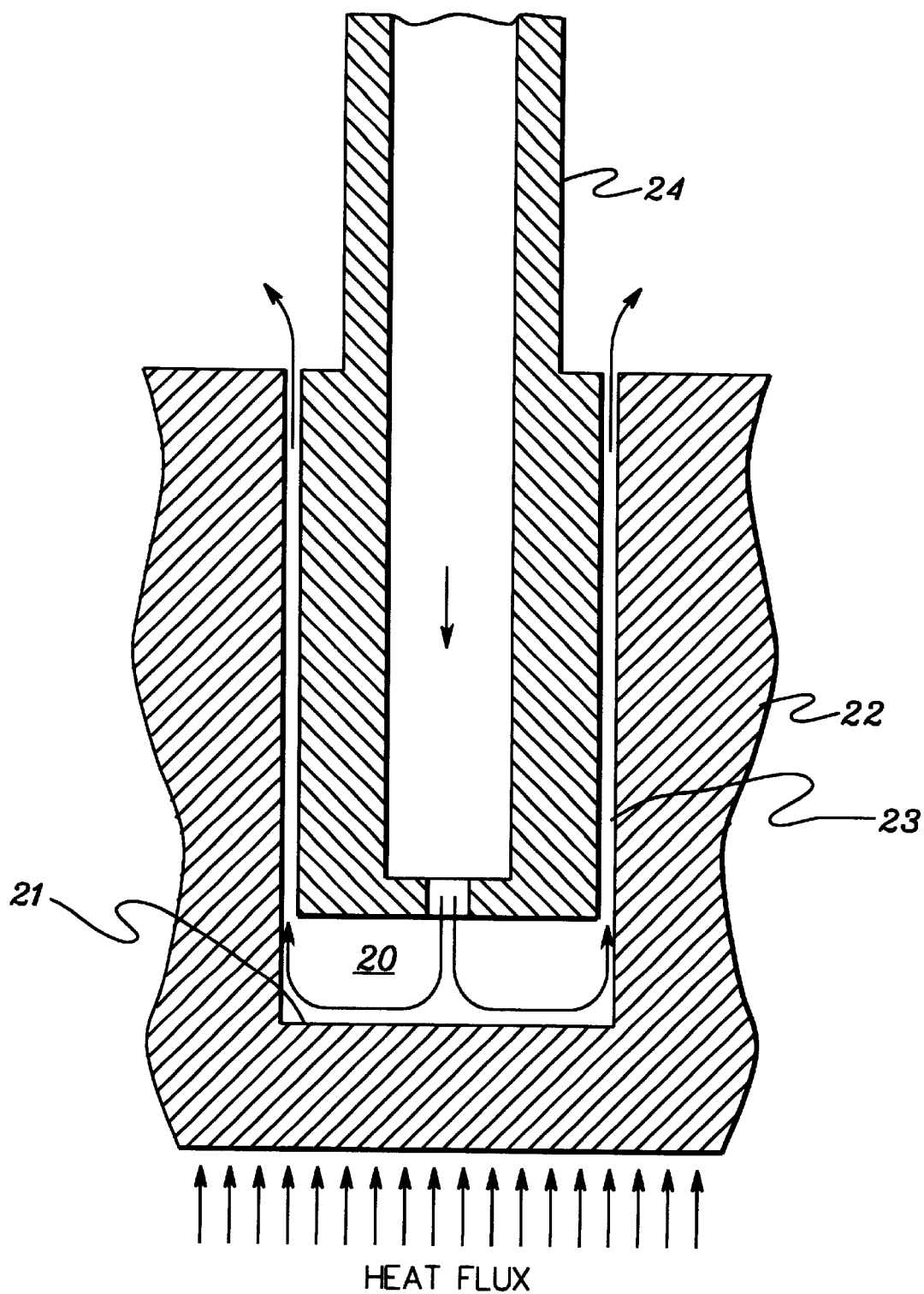
FIG. 2 is a cross-sectional elevational view of one embodiment of a jet cavity plate with a jet nozzle disposed within a blind hole formed therein, and depicting the basic fluid flow concept of a jet cavity cold plate.

A jet cavity cold plate includes a plurality of cavities fabricated within a relatively high thermal conductivity material. FIG. 2 depicts the basic concept for a single cavity 20 within a jet cavity cold plate 22. A jet nozzle 24 is shown partially disposed within jet cavity 20. Cavity 20 is referred to herein as a blind hole, and extends from a first main surface of the cavity plate into the plate towards a second main surface, i.e., the surface receiving the heat flux in FIG. 2. Water, or any other suitable coolant, is directed down the center of nozzle 24 and impinged onto the lower surface 21 of blind hole 20. The jet effluent then flows outward and up a very thin annulus formed between the nozzle 24 and the blind hole sidewall 23. After leaving the annulus, the effluent is directed out of the cold plate, for example, through an outlet plenum (not shown). Very high heat transfer coefficients are established on the cavity surfaces thus making the structure a very low thermal resistance cold plate.

Figure 3A:
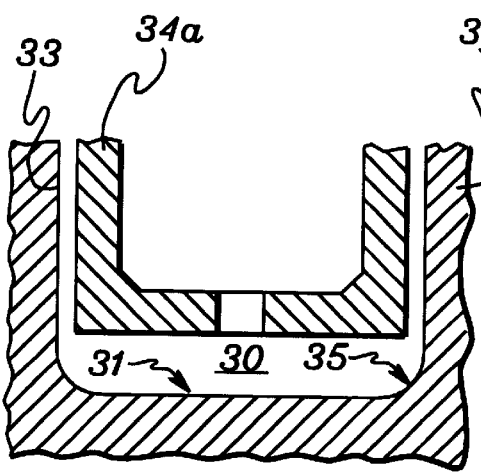
FIGS. 3A–3D depict various cross-sectional elevational embodiments of jet nozzles and blind hole cavity plates formed in accordance with one aspect of the present invention.

Although the basic concept defining the function of the above-summarized jet cavity cold plate has been established, specific enhancements are disclosed herein to further improve thermal performance. In FIG. 2, applicants recognize that there exists a "dead" fluid zone where lower surface 21 of the blind hole 20 meets side surface 23 of the blind hole. The result of this orthogonal intersection is a relatively poor heat transfer to the coolant in this region. The heat transfer characteristics can be improved by providing curvature to the region as shown in FIG. 3A. Even greater enhancement may be realized by providing a matching curvature to the nozzle. See, for example, FIGS. 3B–3D.

In FIG. 3A, a blind hole 30 is defined within a cavity plate 32, and is shown with a jet nozzle 34a. In this embodiment, lower surface 31 of blind hole 30 connects to side surface 33 thereof via a curved portion 35.

Figure 3B:
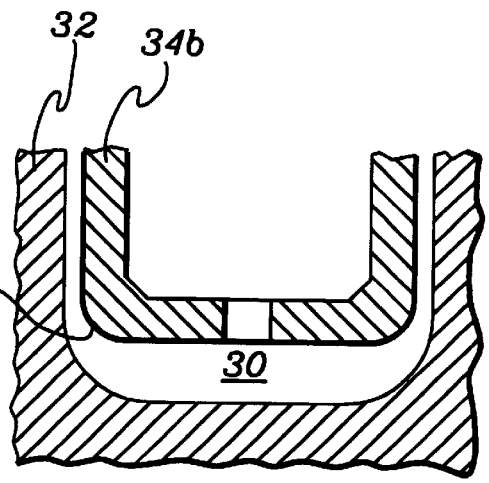
Figure 3C:
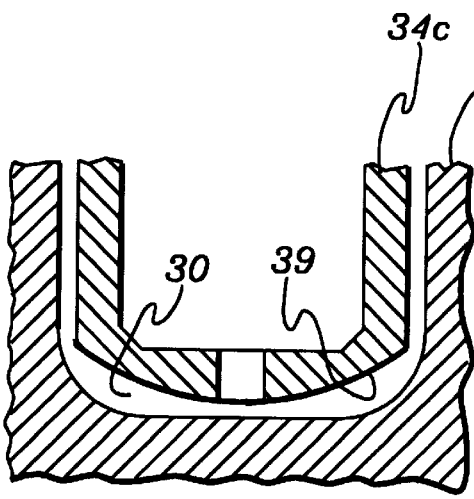
Figure 3D:
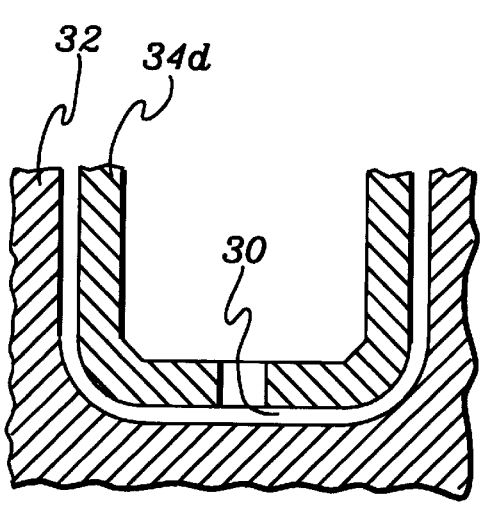
Figure 4A:
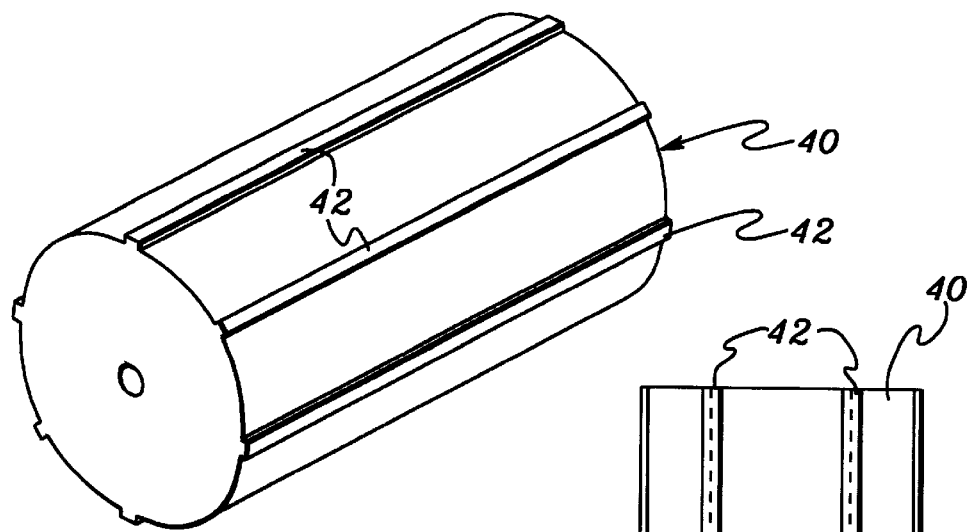
FIG. 4A is a perspective view of one embodiment of a jet nozzle having multiple radially extending pedestals disposed along a side surface thereof in accordance with another aspect of the present invention.
Figure 4B:
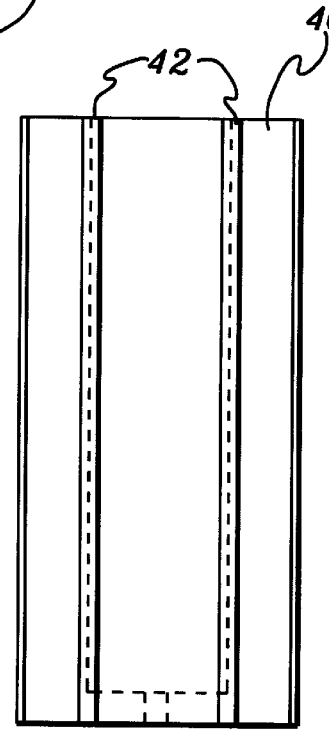
FIG. 4B is an elevational view of the jet nozzle embodiment of FIG. 4A.
Figure 4C:
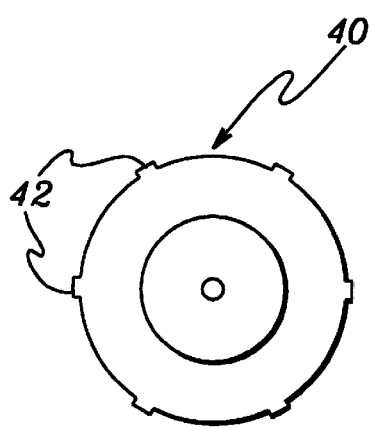
FIG. 4C is a top plan view of the jet nozzle embodiment of FIG. 4A.
Figure 4D:
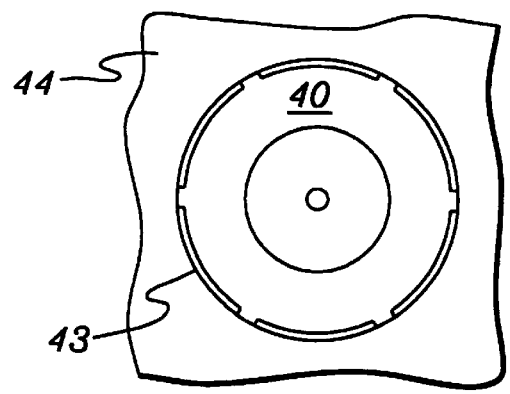
FIG. 4D is a top plan view of the jet nozzle embodiment of FIG. 4A interference fit within a blind hole of a cavity plate in accordance with the principles of the present invention.

In FIG. 3B, jet nozzle 34b has a side surface and lower surface interface which is also slightly curved or angled 37 to further facilitate the transfer of fluid injected into the blind hole 30 outward. In FIG. 3C, jet nozzle 34c has a curved lower surface 39, which again facilitates the removal of fluid from the blind hole after impinging upon the lower surface of the blind hole. In FIG. 3D, the lower surface and side surface of the jet nozzle 34d are configured to conform to the lower surface and sidewall surface, respectively, of blind hole 30 in cavity plate 32. In this embodiment, a uniform spacing is established between the nozzle and the blind hole surface walls.

The heat transfer that takes place within the annulus between the blind hole sidewall and the nozzle surface is inversely proportional to the annulus width between the two surfaces. It is therefore preferable to make the annulus width as small as practical, preferably on the order of 0.1 mm (i.e., 0.004"). However, if this dimension is to vary by as much as 0.001", the average heat transfer coefficient and annulus could change by 25%. Thus, the annulus should be formed with very tight tolerance in its characteristic dimension. This can be accomplished by creating an interference fit between the blind hole sidewalls and individual jet nozzles which are to be disposed therein in accordance with the present invention.

When two members are inserted into one another (for example, a shaft into a hole), and there is no resulting clearance between them, an interference fit is said to be made. The result is a tight joint which has a finite pressure between the two members where the common surfaces contact. It is this pressure that "holds" the pieces together.

By way of example, interference fits can be made in two ways. First, they can be made simply by forcing two members together. This method is usually termed a forced fit or a press fit. The second method, typically referred to as an expansion fit, utilizes the principle of thermal expansion. For example, the part to be inserted is reduced in temperature thus compacting (or shrinking) the member. Sometimes, the receiving member is heated to correspondingly expand the hole. The members are then fitted together and allowed to return to room temperature. In doing so, the inner part expands and the outer part contracts. The result is an interference fit with a significantly greater contact pressure that can be achieved by press fitting alone.

FIGS. 4A–4D illustrate how an annulus may be defined when a jet nozzle is interference fitted within a blind hole formed in a cavity plate. In this embodiment, the jet nozzle 40 has multiple radially extending pedestals 42 disposed along a side surface thereof. These pedestals 42 are sized and configured to physically contact with the inner side surface 43 of a blind hole in a cavity plate 44 (see FIG. 4D).

In one fabrication embodiment of nozzle 40, the jet nozzle's outer side surface can be altered to remove material to a prescribed depth (e.g., 1 mm over all but a small percentage, for example 15–20%) of the nozzle surface area. The alteration can be accomplished through mechanical or chemical means. An example of a mechanical process would be a skiving operation, and an example of a chemical operation would be an etching process. The resulting tolerance on the annuli would be less than 10%.

In addition to defining a narrow annuli using the above fabrication/assembly process, the high pressure contact between the nozzles and the blind hole surface walls will also serve as thermal conduits for heat to pass into the jet nozzles, i.e., providing the nozzles are made of a relatively high thermal conductivity material (e.g., copper). Without heat passage into the nozzles, only the outer surfaces of the annuli contribute to heat transfer. The inner surfaces of the annuli can thus contribute to heat transfer when the nozzles are thermally connected to the blind hole sidewall. Additionally, by establishing a heat flow on both walls, the Nusselt number which relates to the heat transfer taking place between the walls and the fluid is increased. However, the effectiveness of heat transfer from the inner surface is lower because, while thermally connected, the conduction path is still relatively high in thermal resistance. This conduction resistance may be reduced by increasing the area of contact between the nozzle and the blind hole sidewall, but it will come at the expense of reducing the annular surface area for heat transfer into the fluid. FIGS. 8–12 depict various jet nozzle configurations designed to further facilitate heat transfer into the coolant.

Figure 5:
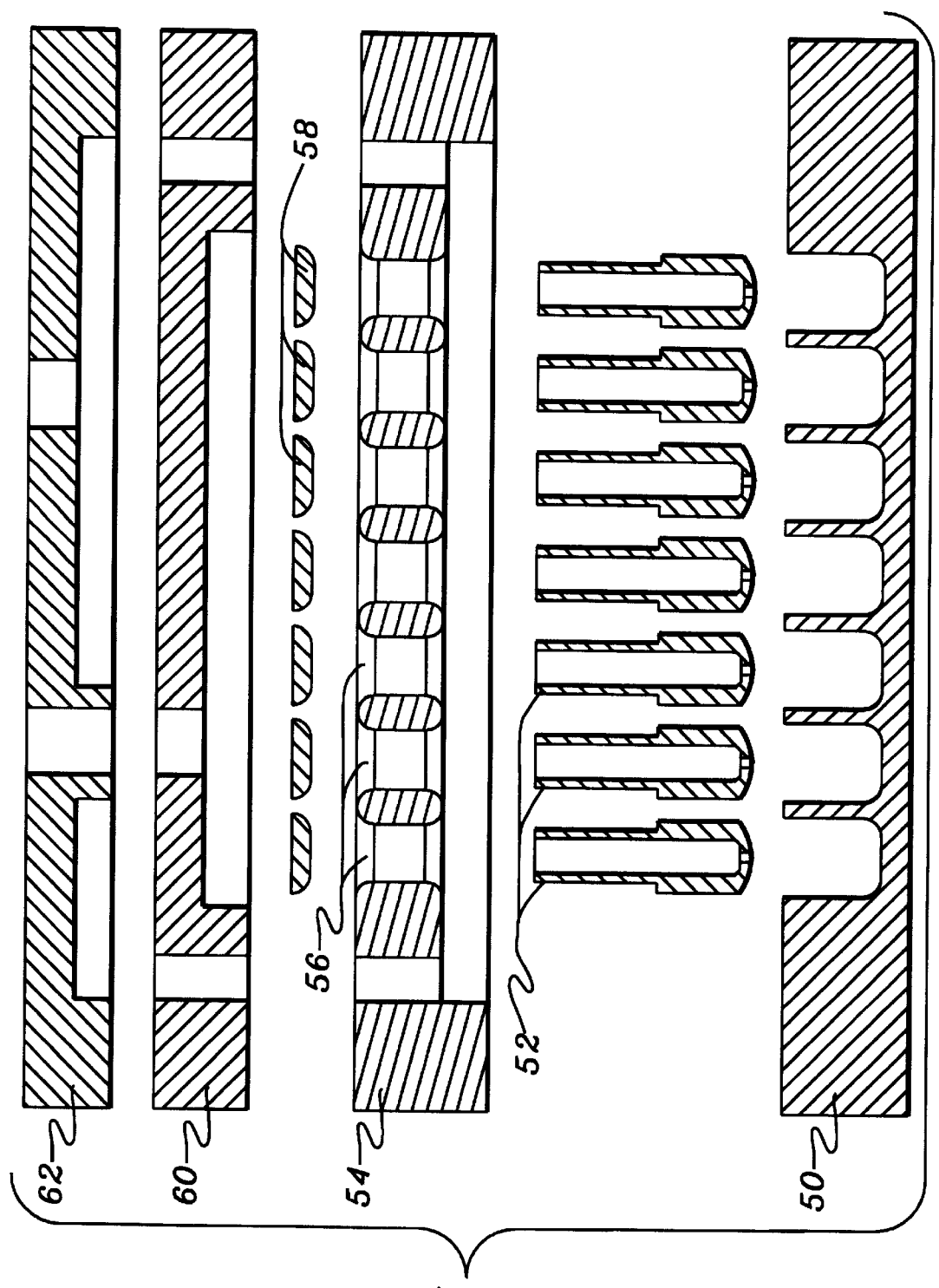
FIG. 5 is an exploded view of one embodiment of a cooling plate assembly employing a plurality of jet nozzles and a cavity plate in accordance with the principles of the present invention.
Figure 6:
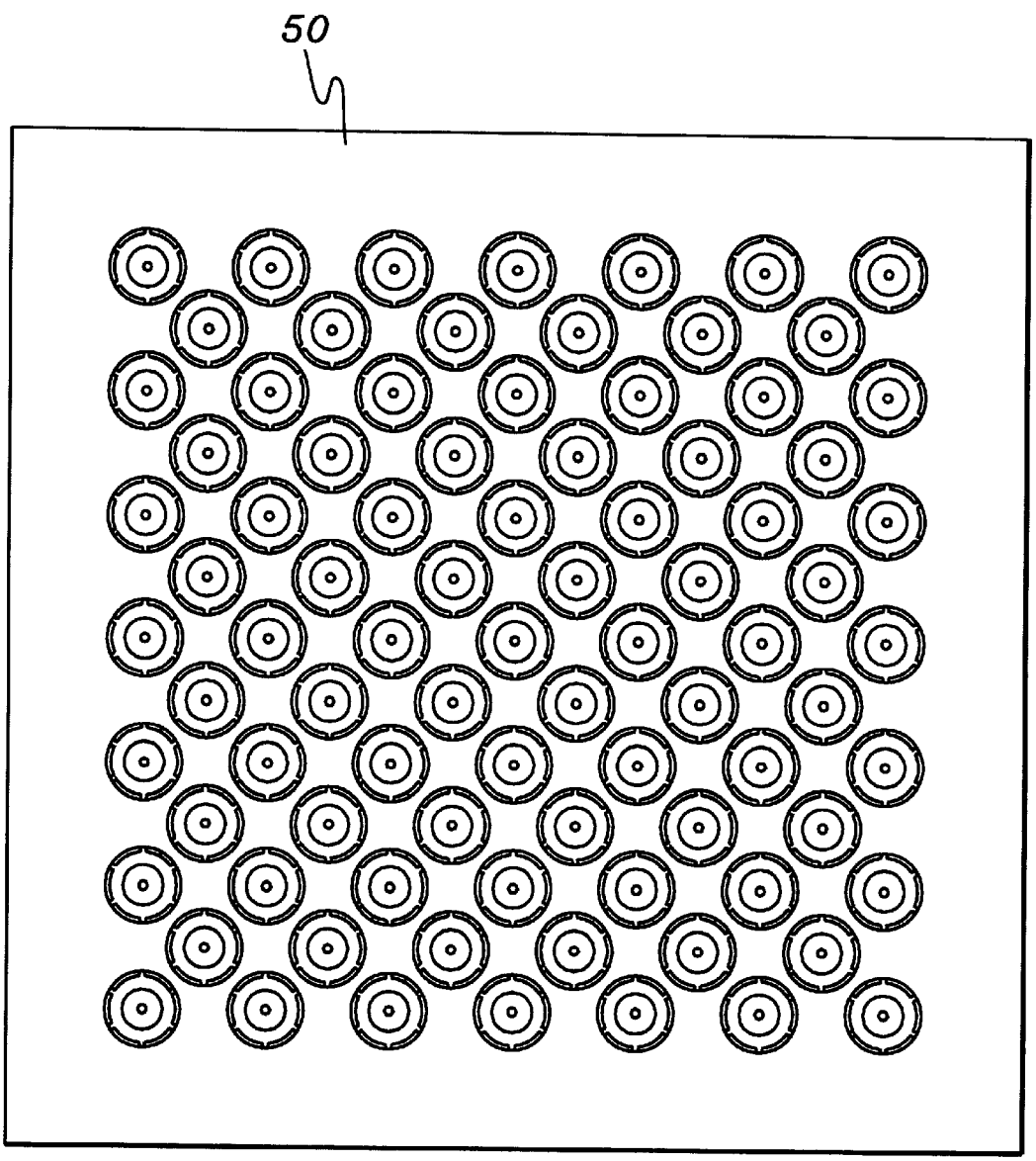
FIG. 6 is a plan view of the assembled cavity plate and jet nozzles of the cooling assembly of FIG. 5 in accordance with the principles of the present invention.
Figure 7:
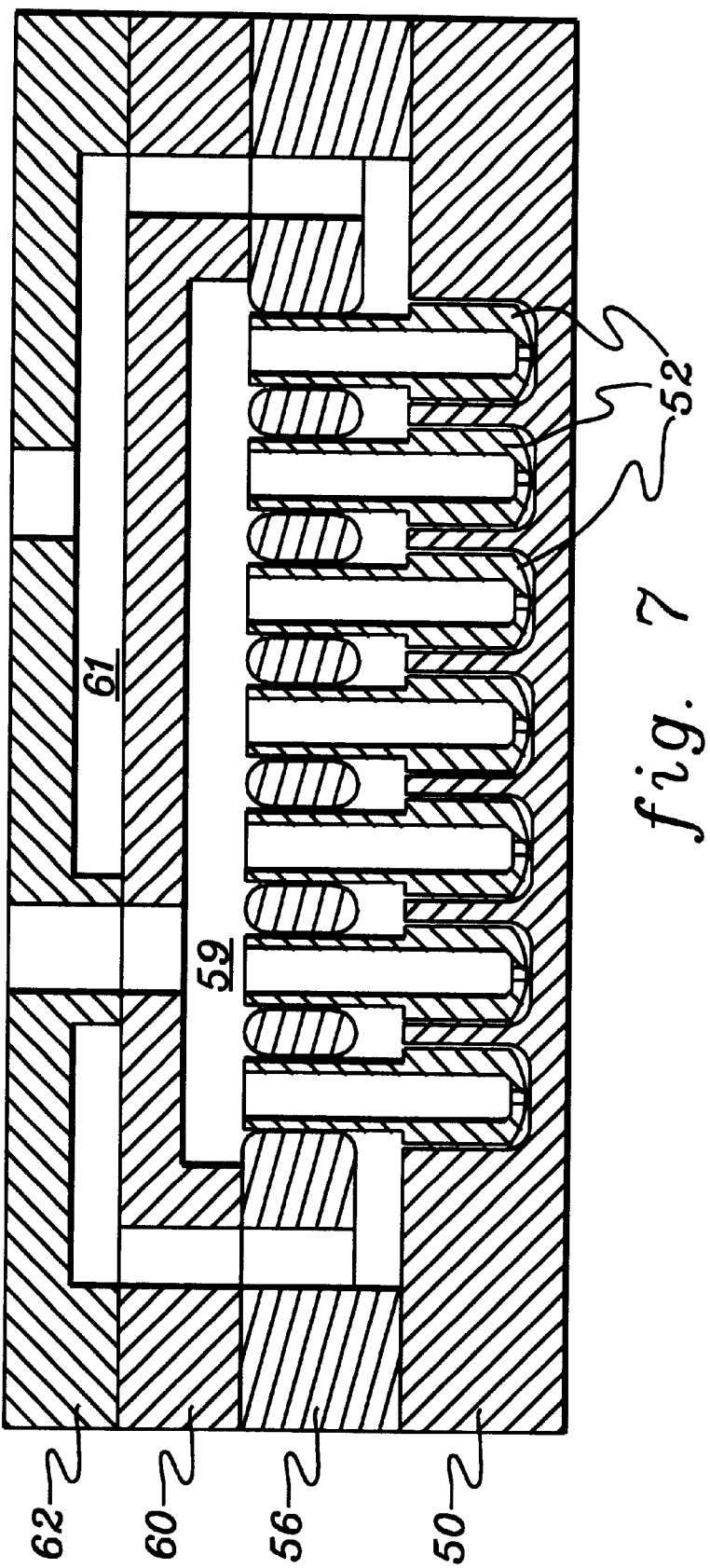
FIG. 7 is a cross-sectional elevational view of one embodiment of the assembled cooling assembly of FIG. 5.

Before discussing these configurations, however, FIG. 5–7 depict one embodiment of a completed cooling assembly in accordance with the principles of the present invention. As shown in FIG. 5, the assembly includes a cavity plate 50, which is machined with one or more blind holes that may or may not have a surface curvature at the lower portion of the cavity in accordance with FIGS. 3A–3D. One or more individual jet nozzles 52 are sized and configured to interference fit inside respective blind holes of cavity plate 50. FIG. 6 illustrates a plan view of one embodiment of a cavity plate/jet nozzle configuration which comprises an interstitial array. Alternatively, cavity patterns could be formed within the cavity plate in any desired configuration, such as an in-line array. Arrays may also be fashioned with varying diameter cavities. Once each nozzle is interference fitted into the respective blind hole, a jet nozzle support plate 54 having openings 56 is brought down over the upper section of each of the plurality of nozzles. This support plate 54 has a through-hole pattern that matches the cavity/nozzle pattern. The upper section of each jet nozzle as a stepped diameter change in this embodiment which facilitates the placement of the jet nozzle support plate. Solder or braze ring pre-forms 58 are then placed over the tips of the jet nozzles and the subassembly is taken through an appropriate solder/braze reflow process. This operation provides the needed isolation between the inlet and outlet reservoirs, which are formed by an inlet plenum plate 60 and an outlet plenum plate 62. Plates 60 and 62 are designed to produce the inlet and outlet plenums when assembled as shown in FIG. 5. A cross-section of one embodiment of the final assembly is shown in FIG. 7. Not shown in FIGS. 5–7 is the perimeter sealing which would be required between the stacked plates. One way to seal the assembly is to concurrently braze or solder the plates in place. The plates may also be sealed in a mechanical compressive fashion by bolting the plates together at the periphery and incorporating conventional compression seals, for example, O-ring, C-ring, gasket, etc.

An additional assembly alternative to solder/brazing the upper sections of the nozzles to the jet nozzle support plate would be to use an elastomer or epoxy to create the isolating joint. Either compound can be applied as a liquid to the annulus formed by the nozzle and jet nozzle support plate and then cured to a solid with appropriate time and temperature processing. This alternative allows more flexibility in choosing a less dense material for the jet nozzle support plate. Furthermore, since the outlet and inlet plenums do not contribute to the transfer of heat, the plenums may be fashioned from a less dense material to reduce weight, such as a light-weight metal or a plastic.

Figure 8:
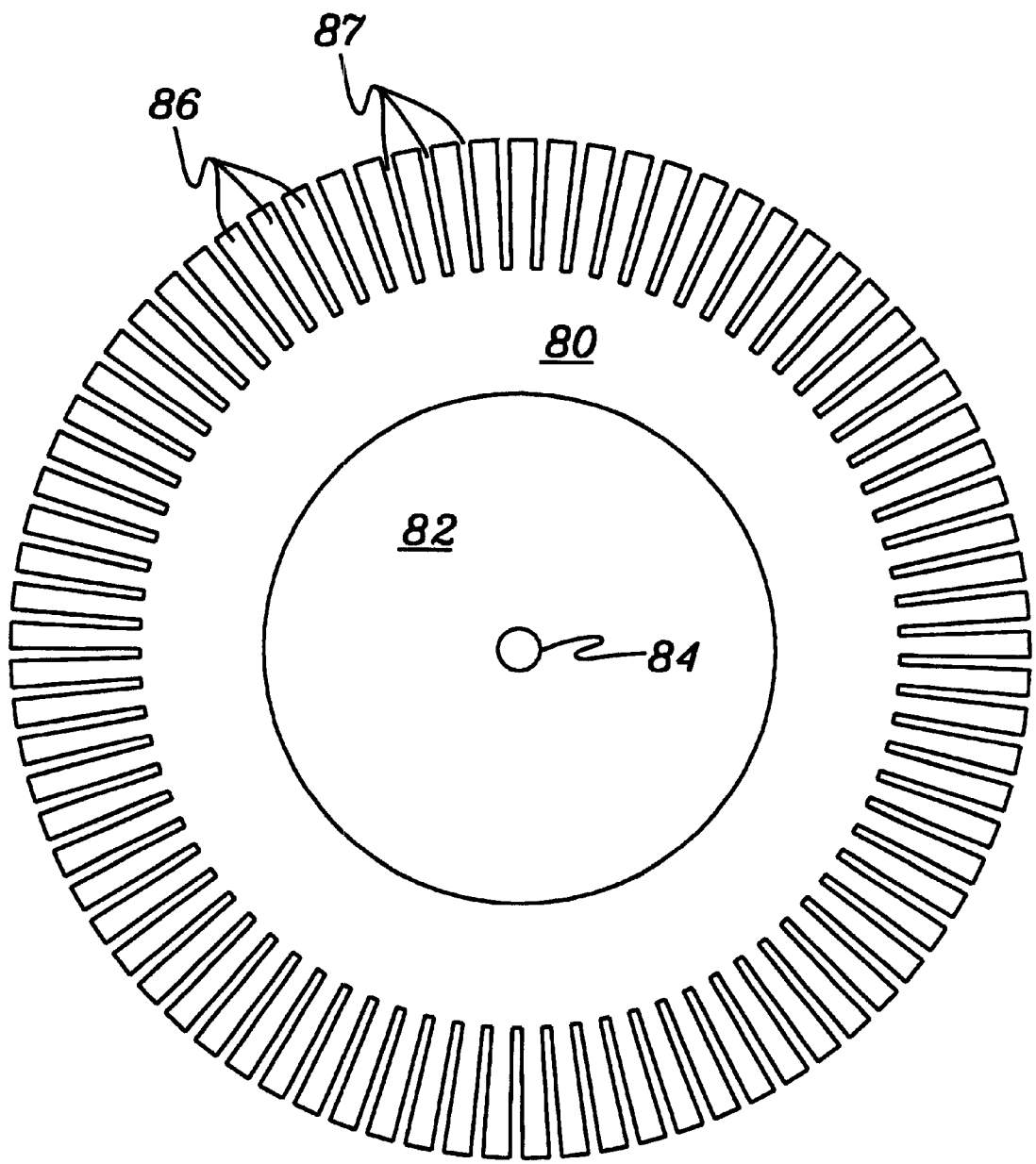
FIG. 8 is a top plan view of an alternative embodiment of a jet nozzle in accordance with another aspect of the present invention.

Additional thermal enhancements may be realized by the formation of a jet nozzle structure which has a plurality of radial microchannels as shown in FIG. 8. In this top down embodiment, jet nozzle 80 has a central channel 82 and an outlet orifice 84 through which coolant passes to impinge upon a lower surface of a blind hole (not shown). Jet nozzle 80 further includes a plurality of closely space, radially extending fins 86 which define therebetween radial microchannels 87. In one fabrication embodiment, the outer surface of jet nozzle 80 undergoes a chemical etching process that produces the radial microchannels with a width on the order of 0.1 mm at an aspect radio (depth/width) of 5–10. Additionally, the number of channels, plus the spacing of the channels, may be chosen such that the sum of the channel widths roughly equals a third of the outer circumference of the nozzle. Both the nozzle/cavity surface contact (i.e., assuming interference fit) and the surface area for heat transfer to the coolant fluid is dramatically increased in this embodiment over that of a more conventional annulus configuration such as depicted in FIG. 2. The former serves to maximize the effective heat transfer of the latter.

Further, it should be noted that the surface curvature enhancements discussed above in connection with FIGS. 3A–3D are independent of the annulus formation and its enhancements such as described in FIGS. 4–8. Thus, the use of radial microchannels as presented in FIG. 8, for example, could be incorporated together with one or more of the nozzle/cavity embodiments of FIGS. 3A–3D, or used separately.

Figure 9A:
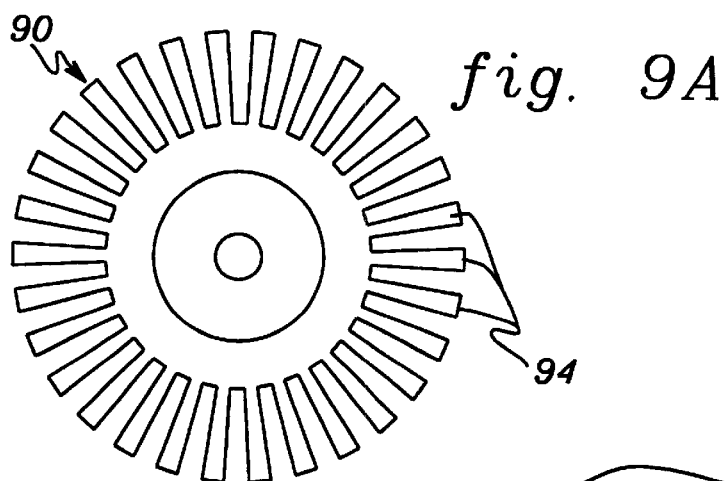
FIG. 9A is a top plan view of still another embodiment of a jet nozzle in accordance with a further aspect of the present invention.

FIGS. 9A–12 present further jet nozzle and cavity plate embodiments which, when assembled, provide significantly more surface area for heat transfer (e.g., 5–10×) compared with a conventional structure such as depicted in FIG. 2, while still maintaining the small spacing necessary for high heat transfer coefficients on the opposing surfaces. In the embodiments of FIGS. 9A–12, the jet nozzle and blind hole of the cavity plate have fins or arms which extend radially and are interdigitated. For example, FIGS. 9A & 9B depict one embodiment of a jet nozzle 90 and a corresponding cavity plate 92. As shown, jet nozzle 90 has a plurality of radially outwardly extending fins 94; and the side surface defining blind hole 93 has a plurality of radially inwardly extending fins 95. When assembled as shown in FIG. 9C, fins 94 on jet nozzle 90 are disposed between fins 95 extending into blind hole 93 of the cavity plate. In other words, the fins of the cavity plate wall are interdigitated with the fins of the jet nozzle. This results in a narrow gap between fins which defines channels 91 for coolant flow. Depending upon the design, the surface area for heat transfer can be increased by a factor of up to 10 times the surface area of a more conventional jet cavity assembly. The geometry depicted in FIGS. 9A–9C represents a 7.1×increase in surface area for heat transfer over a conventional design such as depicted in FIG. 2.

Figure 9B:
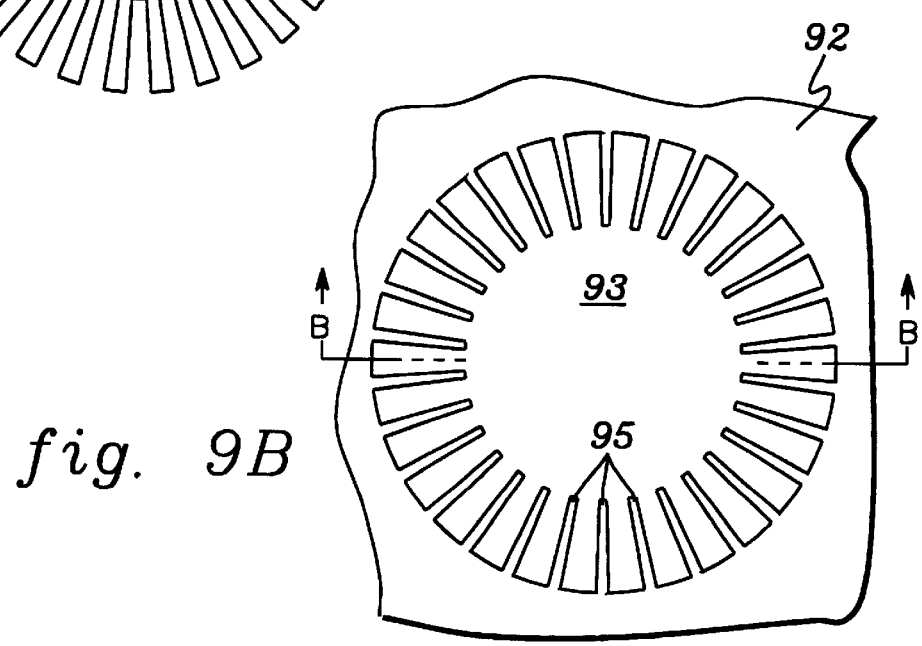
FIG. 9B is a plan view of one embodiment of a blind hole in a cavity plate for use with the jet nozzle embodiment of FIG. 9A in accordance with the principles of the present invention.
Figure 9C:
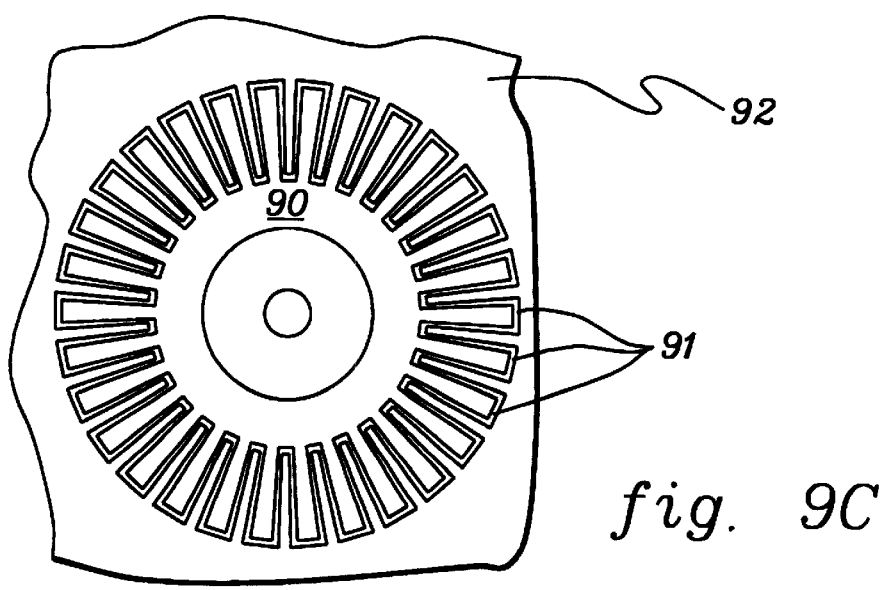
FIG. 9C is a top plan view of the jet nozzle of FIG. 9A disposed within the blind hole of FIG. 9B showing the outwardly projecting fins of the jet nozzle interdigitated with the inwardly projecting fins of the cavity plate in accordance with one aspect of the present invention.
Figure 10A:
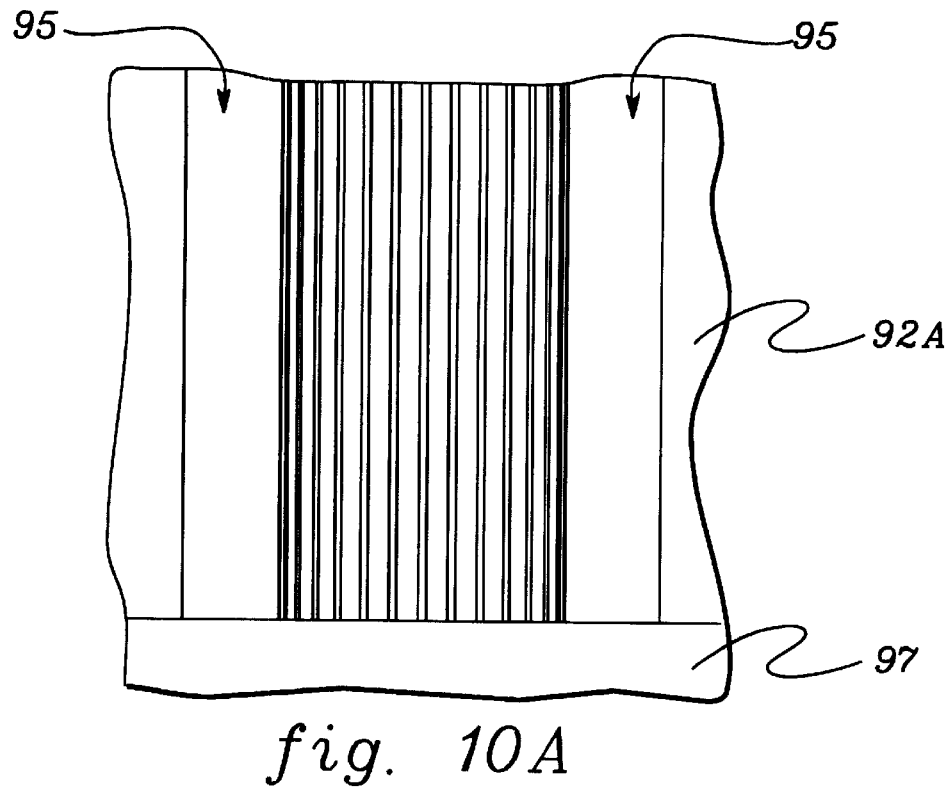
FIG. 10A is a cross-sectional elevational view of one embodiment of the cavity plate and blind hole depicted in FIG. 9B taken along line B—B.
Figure 10B:
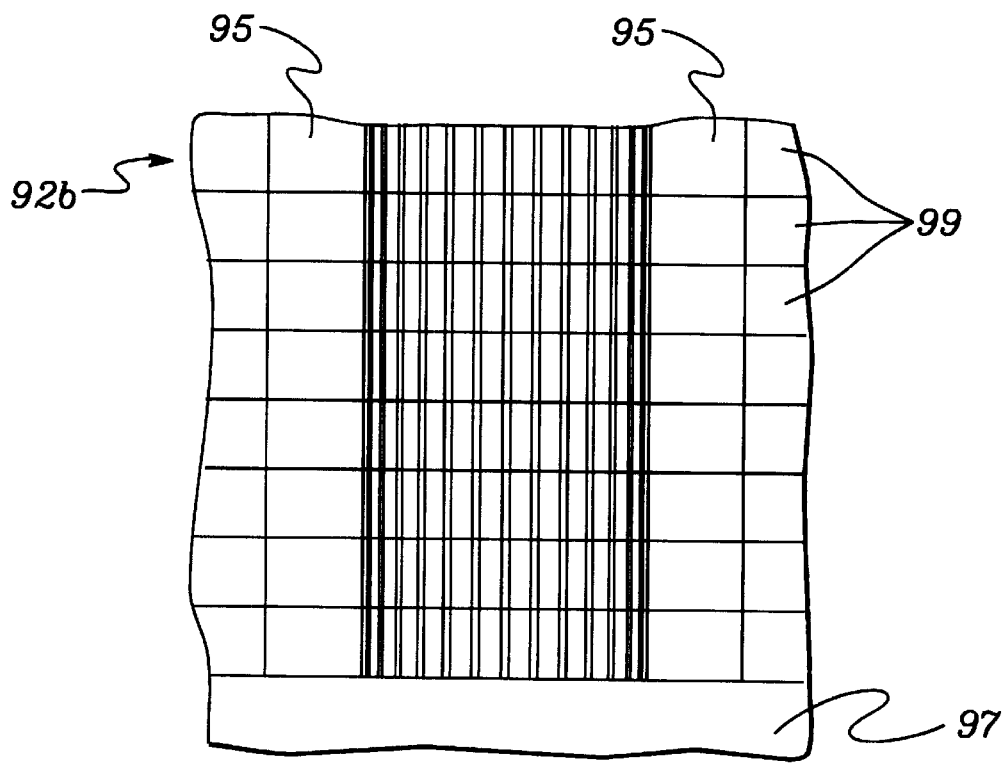
FIG. 10B is a cross-sectional elevational view of an alternate embodiment of the blind hole and cavity plate of FIG. 9B taken along line B—B.

The cavity plate structure of FIG. 9B can be formed, for example, by etching or skiving to remove material within the blind hole to define fins 95. By way of example, one technique is to start with a relatively thick plate (for example, 15–25 mm), drill through holes, and skive the sidewalls to form the fins. The finished plate 92a can then be brazed, soldered or diffusion bonded to a base plate 97 as shown in FIG. 10A (which is a cross-section of plate 92 taken along line B—B in FIG. 9B) to create the final cavity configuration. An alternative manufacturing approach is to pattern relatively thin plates (e.g., 1–1.5 mm) using etching or stamping techniques, stamp the plates, and then braze, solder or diffusion bond the plates to form a laminated final structure 92b as shown in FIG. 10B. As with 10A, the final structure is completed with a base plate 97 which is bonded to the laminated plates 99 defining cavity plate 92b.

Figure 11:
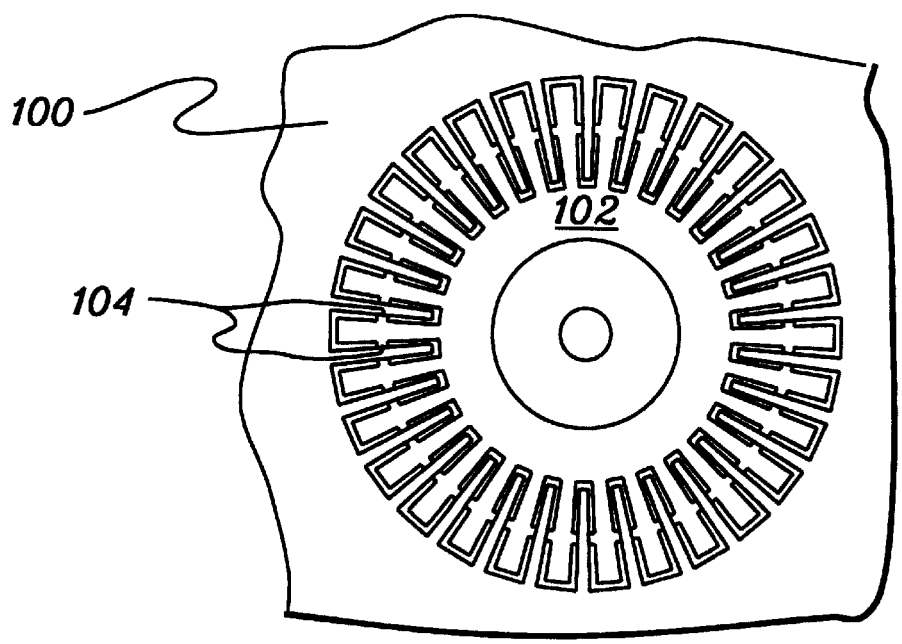
FIG. 11 is a top plan of a further embodiment of a jet nozzle and blind hole cavity plate in accordance with the principles of the present invention, wherein multiple physical contacts are provided between the interdigitated fins of the jet nozzle and the blind hole cavity.

Positioning a jet nozzle within a blind hole cavity so that fins interdigitate and the channels for coolant flow are properly defined can be accomplished in a variety of ways. For example, if the jet nozzle is metal, then providing a press or shrink fit with the nozzle 102 contacting the cavity 100 wall at multiple locations 104 as shown in FIG. 11 will position the insert correctly, plus provide good thermal contact between the blind hole cavity plate and the jet nozzle so that the nozzle surfaces can contribute to the overall heat transfer.

Figure 12:
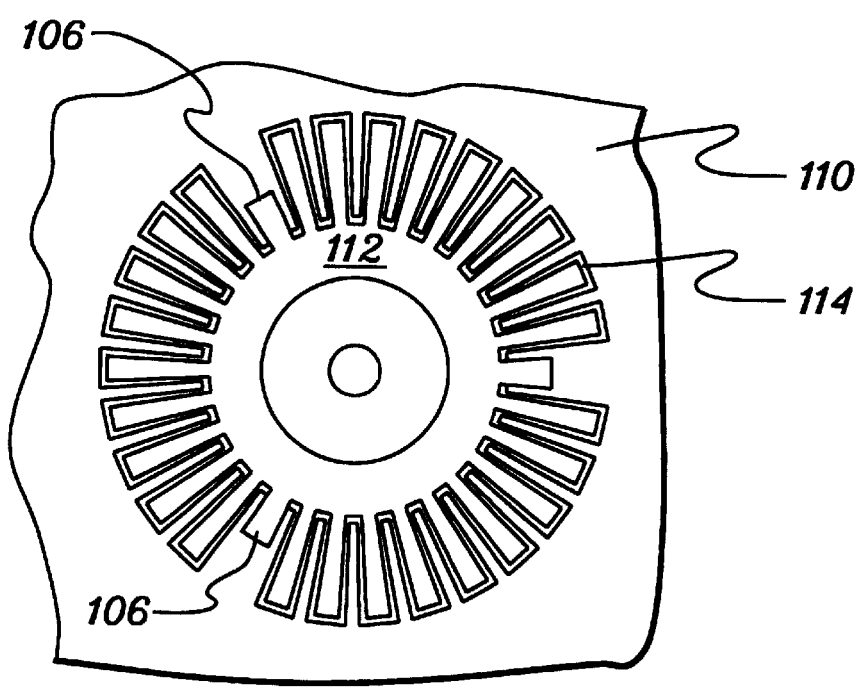
FIG. 12 is a top plan view of an alternate embodiment of a jet nozzle and blind hole cavity in accordance with the principles of the present invention, wherein spacing between the interdigitated fins of the jet nozzle and the blind hole cavity wall is maintained by multiple interference fit key structures disposed therebetween.

As an alternative, a press/shrink fit with a keying structure 106 such as shown in FIG. 12 could also be used to properly position a nozzle 112 within a blind hole cavity plate 110 so as to define a uniform spacing 114 between the interdigitated fins.

To summarize, numerous concepts are presented herein for an enhanced jet nozzle/cavity plate assembly. For example, in accordance with the present invention, jet nozzles are individually placed into the cavity plate and then subsequently secured to a jet nozzle support plate. This allows the formation of annuli between the cavity sidewall and the jet nozzle on the order of 0.002"–0.004" with a tolerance of +/–10% or better. In addition, curvature at the base of a blind hole cavity and/or the base of the jet nozzle facilitates elimination of the conventional "dead" fluid region where the lower surface of the blind hole meets the side surface. By matching the jet nozzle surface curvature to that of the blind hole lower surface and side surface, the surface area within the cavity/nozzle annulus is increased. Further, a nozzle with radial microchannels can be provided to maximize the conductive coupling between a cavity wall and jet nozzle, while also significantly increasing the surface area for heat transfer and maintaining a high heat transfer coefficient commensurate with fluid flows in very narrow channels. Additional concepts are also disclosed and claimed herein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A cooling assembly for an electronic module, said cooling assembly comprising:

a thermally conductive cavity plate having a first main surface and a second main surface with at least one blind hole formed in said second main surface extending towards said first main surface, wherein each blind hole has a lower surface and a side surface, said lower surface and said side surface connecting at a non-orthogonal angle to facilitate the flow of fluid therealong;

at least one jet nozzle, each jet nozzle being sized to reside within a respective blind hole of said at least one blind hole in said cavity plate, wherein fluid introduced into said cavity plate through a jet nozzle of said at least one jet nozzle impinges upon lower surface of said respective blind hole and flows outward through a space defined between said side surface of said blind hole and a side surface of said jet nozzle, wherein said non-orthogonal angle between said lower surface and said side surface of said blind hole facilitates fluid flow, after impinging upon said lower surface, outward through said space defined between said side surface of said blind hole and said side surface of said jet nozzle;

wherein each said jet nozzle includes radially extending pedestals which are sized to physically contact said side surface of said respective blind hole when said jet nozzle is disposed therein, wherein said radially extending pedestals define said space between said side surface of said blind hole and said side surface of said jet nozzle;

wherein for each said jet nozzle, said radial pedestals extend at least partially longitudinally along said jet nozzle within a region of said jet nozzle disposed within said respective blind hole; and wherein said side surface of said at least one blind hole has inwardly extending fins and said side surface of said respective jet nozzle has outwardly extending fins, and wherein said inwardly extending fins of said blind hole interdigitate with said outwardly extending fins of said net nozzle, with said for removing fluid comprising a gap between said interdigitated fins.

2. The cooling assembly of claim 1, further comprising multiple physical contacts between said inwardly extending fins of said at least one blind hole and said outwardly extending fins of said respective jet nozzle, wherein said multiple physical contacts comprise multiple thermal contacts for facilitating heat transfer from said inwardly extending fins of said blind hole to said outwardly extending fins of said jet nozzle.

3. The cooling assembly of claim 1, further comprising at least one interference fit key structure disposed between said at least one blind hole and said respective jet nozzle for ensuring said gap between said interdigitated fins.

4. A cooling assembly for an electronic module, said cooling assembly comprising:

a thermally conductive cavity plate having a first main surface and a second main surface with at least one blind hole formed in said second main surface extending towards said first main surface, wherein each blind hole has a lower surface and a side surface, said lower surface and said side surface connecting at a non-orthogonal angle to facilitate the flow of fluid therealong;

at least one jet nozzle, each jet nozzle being sized to reside within a respective blind hole of said at least one blind hole in said cavity plate, wherein fluid introduced into said cavity plate through a jet nozzle of said at least one jet nozzle impinges upon said lower surface of said respective blind hole and flows outward through a space defined between said side surface of said blind hole and a side surface of said jet nozzle, wherein said non-orthogonal angle between said lower surface and said side surface of said blind hole facilitates fluid flow, after impinging upon said lower surface, outward through said space defined between said side surface of said blind hole and said side surface of said jet nozzle;

wherein said at least one blind hole comprises a plurality of blind holes formed in said second main surface extending toward said first main surface of said cavity plate, and wherein said at least one jet nozzle comprises a plurality of jet nozzles, each jet nozzle being sized to reside within a respective blind of said plurality of blind holes in said cavity plate; and wherein at least one jet nozzle of said plurality of jet nozzles has a side surface with a plurality of radial channels disposed therein, said radial channels comprising said space defined between said side surface of said blind hole and said side surface of said jet nozzle, wherein fluid delivered through said at least one jet nozzle impinges upon said lower surface of said respective blind hole and flows outward through said plurality of radial channels.

5. A cooling assembly for an electronic module, said cooling assembly comprising:

a thermally conductive cavity plate having a first main surface and a second main surface with at least one blind hole formed in said second main surface extending towards said first main surface, wherein each blind hole has a lower surface and a side surface;

at least one jet nozzle, each jet nozzle being sized to reside within a respective blind hole in said cavity plate, wherein fluid introduced into said cavity plate through a jet nozzle of said at least one jet nozzle impinges upon said lower surface of said respective blind hole and flows outward through a space defined between said side surface of said blind hole and a side surface of said jet nozzle; and wherein a jet nozzle of said at least one jet nozzle comprises a side surface having a plurality of radial channels disposed therein, wherein said space defined between said side surface of said blind hole and said side surface of said jet nozzle comprises said plurality of radial channels, and wherein fluid delivered through said jet nozzle impinges upon said lower surface of said respective blind hole and flows outward from said blind hole at least partially through said plurality of radial channels disposed within said jet nozzle.

6. The cooling assembly of claim 5, wherein said jet nozzle having said radial channels is sized and configured with said side surface to be in physical contact with said side surface of said respective blind hole when said jet nozzle is disposed therein, wherein said fluid delivered through said jet nozzle impinges upon said lower surface of said blind hole and is removed from said blind hole through said plurality of radial channels disposed within said jet nozzle.

7. The cooling assembly of claim 5, wherein said plurality of radial channels are defined by a plurality of outwardly extending fins on said side surface of said jet nozzle, and wherein said respective blind hole further comprises a plurality of inwardly extending fins sized and configured such that said outwardly extending fins of said jet nozzle interdigitate with said inwardly extending fins on said side surface of said blind hole, with a gap being defined between fins, wherein said space defined between said side surface of said blind hole and said side surface of said jet nozzle comprises said gap defined between said interdigitated fins.

8. cooling assembly of claim 7, wherein said thermally conductive cavity plate comprises a laminate structure having a plurality of cavity plate layers secured together.

9. The cooling assembly of claim 7, further comprising multiple physical contacts disposed between said inwardly extending fins of said at least one blind hole and said outwardly extending fins of said respective jet nozzle, wherein said multiple physical contacts comprise multiple thermal contacts which facilitate heat transfer from said inwardly extending fins of said blind hole to said outwardly extending fins of said jet nozzle.

10. The cooling assembly of claim 7, further comprising at least one interference fit key structure disposed between said at least one blind hole and said respective jet nozzle for ensuring said gap between said interdigitated fins.

11. The cooling assembly of claim 5, wherein at least one of said lower surface of each said blind hole and a lower surface of said respective jet nozzle is at least partially curved to facilitate flow of fluid delivered through said jet nozzle from said blind hole after impinging upon said lower surface of said blind hole.

12. The cooling assembly of claim 5, wherein said at least one blind hole comprises a plurality of blind holes in said cavity plate formed in said second main surface extending toward said first main surface, and wherein said at least one jet nozzle comprises a plurality of jet nozzles, each jet nozzle being sized to reside within a respective blind hole of said plurality of blind holes in said cavity plate.

13. The cooling assembly of claim 12, further comprising a jet nozzle support plate, wherein each jet nozzle of said plurality of jet nozzles resides at least partially within said cavity plate and at least partially within said jet nozzle support plate, and wherein said plurality of jet nozzles are secured to said jet nozzle support plate, and wherein said assembly further comprises an inlet plenum for providing fluid to said plurality of jet nozzles and an outlet plenum for removing fluid from said plurality of blind holes after fluid delivered through said plurality of jet nozzles has impinged upon said lower surfaces of said blind holes.

14. A cooling assembly for an electronic module, said cooling assembly comprising:
   a thermally conductive cavity plate having a first main surface and a second main surface with at least one blind hole formed in said second main surface extending towards said first main surface, wherein each blind hole has a lower surface and a side surface, said lower surface and said side surface connecting at a non-orthogonal angle to facilitate the flow of fluid therealong;
   at least one jet nozzle, each jet nozzle being sized to reside within a respective blind hole of said at least one blind hole in said cavity plate, wherein fluid introduced into said cavity plate through a jet nozzle of said at least one jet nozzle impinges upon said lower surface of said respective blind hole and flows outward through a space defined between said side surface of said blind hole and a side surface of said jet nozzle;
   wherein within each blind hole said lower surface and said side surface thereof connect via a curved surface which facilitates outward transfer of fluid to said space between said side surface of said blind hole and said side surface of said jet nozzle after said fluid has impinged upon said lower surface; and
   wherein each jet nozzle further comprises a lower surface, said lower surface meeting said side surface of said jet nozzle at a curved portion to facilitate the flow of fluid delivered through said jet nozzle from said blind hole after impinging upon said lower surface of said blind hole, wherein the curved portion inhibits recirculation of fluid flowing along the lower surface to the side surface of the jet nozzle.

15. The cooling assembly of claim 14, wherein said side surface and said lower surface of each jet nozzle have a surface shape conforming to an opposing surface shape of said side surface and said lower surface of said respective blind hole, with a uniform space being defined between said side surface of said blind hole and said side surface of said jet nozzle and between said lower surface of said blind hole and said lower surface of said jet nozzle.

16. The cooling assembly of claim 14, wherein said lower surface of each jet nozzle comprises a curved surface.

17. The cooling assembly of claim 14, wherein each said jet nozzle includes radially extending pedestals which are sized to physically contact said side surface of said respective blind hole when said jet nozzle is disposed therein, wherein said radially extending pedestals define said space between said side surface of said blind hole and said side surface of said jet nozzle.

18. The cooling assembly of claim 17, wherein for each said jet nozzle, said radial pedestals extend at least partially longitudinally along said jet nozzle within a region of said jet nozzle disposed within said respective blind hole.

19. The cooling assembly of claim 14, wherein said at least one blind hole comprises a plurality of blind holes formed in said second main surface extending toward said first main surface of said cavity plate, and wherein said at least one jet nozzle comprises a plurality of jet nozzles, each jet nozzle being sized to reside within a respective blind hole of said plurality of blind holes in said cavity plate.

20. The cooling assembly of claim 19, further comprising a jet nozzle support plate, wherein each jet nozzle of said plurality of jet nozzles resides at least partially within said cavity plate and at least partially within said jet nozzle support plate, and wherein said plurality of jet nozzles are secured to said jet nozzle support plate, said jet nozzle support plate facilitating maintenance of said space between said side surface of each blind hole and said side surface of said respective jet nozzle.

21. The cooling assembly of claim 20, further comprising an inlet plenum for providing fluid to said plurality of jet nozzles and an outlet plenum for removing fluid from said plurality of blind holes after fluid delivered through said plurality of jet nozzles has impinged upon said lower surfaces of said blind holes.

22. The cooling assembly of claim 14, wherein said first main surface of said thermally conductive cavity plate is configured to thermally couple to an electronic module for dissipating heat received therefrom, and wherein at least one of said lower surface of each blind hole and a lower surface of said respective jet nozzle disposed therein, is at least partially curved to facilitate the flow of fluid from said blind hole and thereby enhance heat transfer from said electronic module to said fluid when said cooling assembly is thermally coupled to said electronic module.

23. A method of fabricating a cooling assembly for an electronic module, said method comprising:
   providing a thermally conductive cavity plate having a first main surface and a second main surface with a plurality of blind holes formed in said second main surface extending toward said first main surface, wherein each blind hole has a lower surface and side surface;
   providing a plurality of jet nozzles, multiple jet nozzles including radially extending pedestals on a side surface thereof which are sized to physically contact said surface of said respective blind hole when said jet nozzles are disposed at least partially therein; and
   separately interference fitting each jet nozzle of said multiple jet nozzles of said plurality of jet nozzles into a respective blind hole of said plurality of blind holes, wherein fluid introduced into said cavity plate through said multiple jet nozzles of said plurality of jet nozzles impinges upon said lower surface of said respective blind hole and flows outward through a space defined between said side surface of said blind hole and said side surface of said jet nozzle, and wherein said radially extending pedestals physically contacting said side surface of said blind hole define a size of said space between said side surface of said blind hole and said side surface of said jet nozzle.

24. The method of claim 23, further comprising providing a jet nozzle support plate, with each jet nozzle of said plurality of jet nozzles being sized to reside at least partially within said jet nozzle support plate, and wherein said method further comprises securing each jet nozzle of said plurality of jet nozzle to said jet nozzle support plate after said multiple jet nozzles have been separately interference fit into respective blind holes.

25. The method of claim 24, wherein said securing of each jet nozzle to said jet nozzle support plate comprises soldering each said jet nozzle to said jet nozzle support plate after said jet nozzle has been interference fit within said respective blind hole of said thermally conductive cavity plate.

26. The method of claim 25, wherein each jet nozzle of said plurality of jet nozzles includes radially extending pedestals on a side surface thereof, said pedestals being sized to physically contact a side surface of a respective blind hole when the jet nozzle is disposed therein, and wherein said method further comprises interference fitting each jet nozzle of said plurality of jet nozzles into its respective blind hole of said cavity plate, and thereafter soldering each said jet nozzle to said jet nozzle support plate.

27. The method of claim 23, wherein said radially extending pedestals define a plurality of radial channels therebetween, and wherein when said at least one jet nozzle is interference fit into said respective blind hole, fluid delivered through said jet nozzle impinges upon said lower surface of said blind hole and moves outward from said blind hole through said plurality of radial channels defined between said radially extending pedestals of said jet nozzle.

28. A method of fabricating a cooling assembly for an electronic module, said method comprising:
    providing a thermally conductive cavity plate having a first main surface and a second main surface with a plurality of blind holes formed in said second main surface extending toward said first main surface, wherein each blind hole has a lower surface and a side surface, and radially inwardly extending fins disposed along said side surface;
    providing a plurality of jet nozzles, each jet nozzle including radially outwardly extending fins on a side surface thereof configured to interdigitate with said inwardly extending fins on said side surface of a respective blind hole when said jet nozzle is disposed within said blind hole, with a gap being defined between said interdigitated fins; and
    disposing each jet nozzle of said plurality of jet nozzles within said respective blind hole of said plurality of blind holes, wherein fluid introduced into said cavity plate through each jet nozzle of said plurality of jet nozzles impinges upon said lower surface of said respective blind hole and flows outward through said gap defined between said interdigitated fins of said side surface of said blind hole and said jet nozzle.

29. The method of claim 28, wherein said disposing comprises interference fitting each jet nozzle of said plurality of jet nozzles into said respective blind hole of said plurality of blind holes, said interference fitting comprising providing at least one interference fit key structure disposed between each said jet nozzle and said respective blind hole for ensuring said gap between said interdigitated fins.

30. The method of claim 28, wherein said disposing comprises interference fitting each jet nozzle of said plurality of jet nozzles into said respective blind hole of said plurality of blind holes, said interference fitting comprising providing multiple physical contacts disposed between said inwardly extending fins of each said blind hole and said outwardly extending fins of said respective jet nozzle, wherein said multiple physical contacts comprise multiple thermal contacts which facilitate heat transfer from said inwardly extending fins of said blind hole to said outwardly extending fins of said jet nozzle.

* * * * *

UNITED STATES PATENT AND TRADEMARK OFFICE
CERTIFICATE OF CORRECTION

PATENT NO. : 6,431,260 B1
DATED : August 13, 2002
INVENTOR(S) : Agonafer et al.

It is certified that error appears in the above-identified patent and that said Letters Patent is hereby corrected as shown below:

Column 8,
Line 62, insert the word -- said -- after the word upon

Column 9,
Line 20, insert the word -- space -- after the word said in the second instance Column 10,
Line 51, insert the word -- The -- at the beginning of the sentence Signed and Sealed this Tenth Day of December, 2002

JAMES E. ROGAN
*Director of the United States Patent and Trademark Office*